United States Patent
Ashidate

(10) Patent No.: US 9,269,734 B2
(45) Date of Patent: Feb. 23, 2016

(54) METHOD OF MANUFACTURING SOLID-STATE IMAGING DEVICE

(71) Applicant: Kabushiki Kaisha Toshiba, Minato-ku (JP)

(72) Inventor: Hiroaki Ashidate, Oita (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/175,040

(22) Filed: Feb. 7, 2014

(65) Prior Publication Data

US 2015/0035102 A1    Feb. 5, 2015

(30) Foreign Application Priority Data

Jul. 31, 2013    (JP) ................................. 2013-159858

(51) Int. Cl.
*H01L 21/00* (2006.01)
*H01L 27/146* (2006.01)

(52) U.S. Cl.
CPC .......... *H01L 27/1463* (2013.01); *H01L 27/146* (2013.01); *H01L 27/1464* (2013.01); *H01L 27/14603* (2013.01); *H01L 27/14607* (2013.01); *H01L 27/14623* (2013.01); *H01L 27/14685* (2013.01)

(58) Field of Classification Search
CPC .............. H01L 27/146; H01L 27/1463; H01L 27/14603; H01L 27/14607
USPC .......................................... 438/65, 66, 69, 70
See application file for complete search history.

(56) References Cited

U.S. PATENT DOCUMENTS

2004/0016935 A1* 1/2004 Kubota et al. ................... 257/98
2005/0253045 A1* 11/2005 Oda ............................ 250/208.1

(Continued)

FOREIGN PATENT DOCUMENTS

JP    2001-111028 A    4/2001
JP    2011-54741    3/2011

(Continued)

OTHER PUBLICATIONS

Office Action issued Aug. 13, 2015 in Korean Patent Application No. 10-2014-0016434 (with English language translation).

(Continued)

*Primary Examiner* — Matthew E Warren
(74) *Attorney, Agent, or Firm* — Oblon, McClelland, Maier & Neustadt, L.L.P.

(57) ABSTRACT

According to one embodiment, the method of manufacturing a solid-state imaging device includes: forming a plurality of photoelectric conversion elements by two-dimensionally arranging semiconductor areas of a second conductivity type at a semiconductor layer of a first conductivity type in a matrix pattern; forming the photoelectric conversion elements in a rectangular shape in plan view, the photoelectric conversion elements being formed by forming a grid-like trench in plan view so as to partition the semiconductor layer; forming the photoelectric conversion element formed into the rectangular shape in plan view into a convex polygonal shape in plan view whose number of corners is larger than the number of corners of a rectangular; and forming an element isolation area including a light shielding member at a trench coated with an insulating film after coating an inner peripheral surface of the trench with the insulating film.

3 Claims, 7 Drawing Sheets

(56) References Cited

U.S. PATENT DOCUMENTS

| | | |
|---|---|---|
| 2010/0201834 A1* | 8/2010 | Maruyama et al. ........ 348/222.1 |
| 2012/0217601 A1 | 8/2012 | Miyanami |
| 2012/0217602 A1* | 8/2012 | Enomoto ...................... 257/432 |
| 2015/0028442 A1* | 1/2015 | Miyanami ..................... 257/435 |

FOREIGN PATENT DOCUMENTS

| | | |
|---|---|---|
| JP | 2012-175050 | 9/2012 |
| JP | 2012-178457 | 9/2012 |
| JP | 2013-30803 | 2/2013 |
| WO | WO 2012/132760 A1 | 10/2012 |

OTHER PUBLICATIONS

Office Action issued Sep. 11, 2015 in Taiwanese Patent Application No. 103104404 (with English language translation).

Office Action issued Mar. 18, 2015 in Korean Patent Application No. 10-2014-0016434 (with English language translation).

* cited by examiner

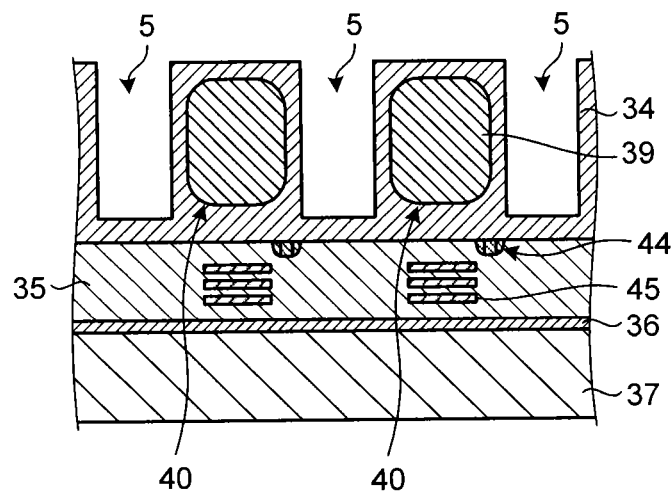
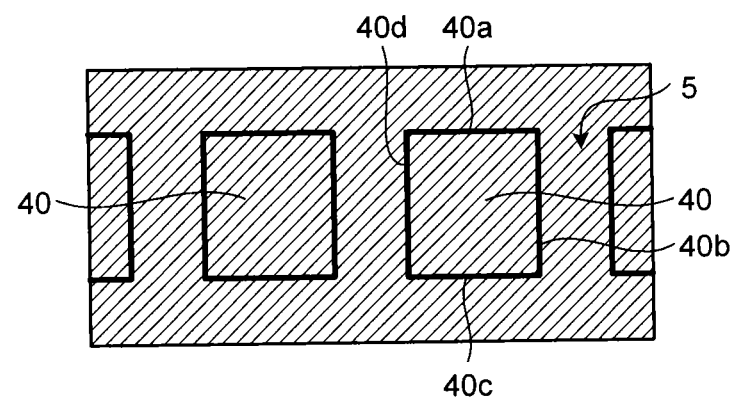
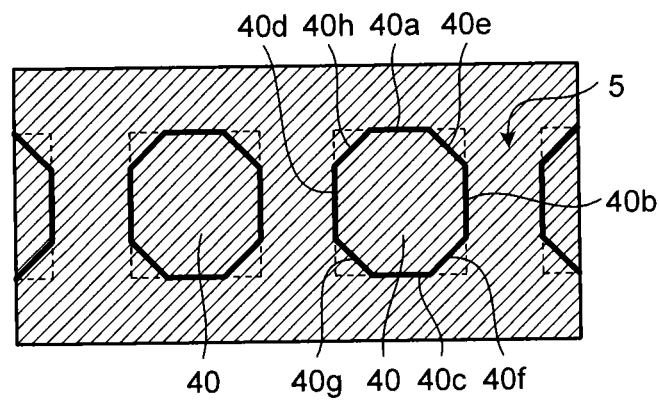

METHOD OF MANUFACTURING SOLID-STATE IMAGING DEVICE

CROSS-REFERENCE TO RELATED APPLICATION

This application is based upon and claims the benefit of priority from Japanese Patent Application No. 2013-159858, filed on Jul. 31, 2013; the entire contents of which are incorporated herein by reference.

FIELD

Embodiments described herein relate generally to a method of manufacturing a solid-state imaging device and the solid-state imaging device.

BACKGROUND

Conventionally, electronic devices, such as a digital camera and a portable terminal with camera function, include a camera module with a solid-state imaging device. The solid-state imaging device includes a plurality of photoelectric conversion elements. The plurality of photoelectric conversion elements is two-dimensionally arranged in a matrix pattern corresponding to respective pixels of a captured image. Each photoelectric conversion element photoelectrically converts incident light into electric charge of an amount corresponding to an amount of received light and accumulates the electric charges as signal electric charges indicating luminance of each pixel.

Between each of the photoelectric conversion elements, an element isolation area is disposed. The element isolation area electrically and elementally separates the photoelectric conversion elements. The element isolation area is, for example, formed as follows. A grid-like trench (groove) is formed at a semiconductor layer where a plurality of the respective photoelectric conversion elements is formed. The trench surrounds each photoelectric conversion element in a rectangular shape in plan view. An insulating material is embedded in the trench.

The trench for element isolation is generally formed by Reactive Ion Etching (RIE). However, dangling bond may be generated on a surface of the trench formed by RIE. Since an electron caused by dangling bond is generated regardless of existence of incident light, the electron appears as white defect in the captured image, causing image degradation.

BRIEF DESCRIPTION OF THE DRAWINGS

FIGS. 5A to 7C are schematic views of a cross section illustrating the manufacturing process of the solid-state imaging device according to the embodiment.

DETAILED DESCRIPTION

In general, according to one embodiment, a method of manufacturing a solid-state imaging device includes: forming a plurality of photoelectric conversion elements by two-dimensionally arranging semiconductor areas of a second conductivity type at a semiconductor layer of a first conductivity type in a matrix pattern; forming the photoelectric conversion elements in a rectangular shape in plan view, the photoelectric conversion elements being formed by forming a grid-like trench in plan view so as to partition the semiconductor layer; forming the photoelectric conversion element formed into the rectangular shape in plan view into a convex polygonal shape in plan view whose number of corners is larger than the number of corners of a rectangular; and forming an element isolation area including a light shielding member at a trench, the trench being coated with an insulating film, the forming being performed after an inner peripheral surface of the trench being coated with the insulating film.

Exemplary embodiments of a method of manufacturing a solid-state imaging device and the solid-state imaging device will be explained below in detail with reference to the accompanying drawings. The present invention is not limited to the following embodiments.

Figure 1:
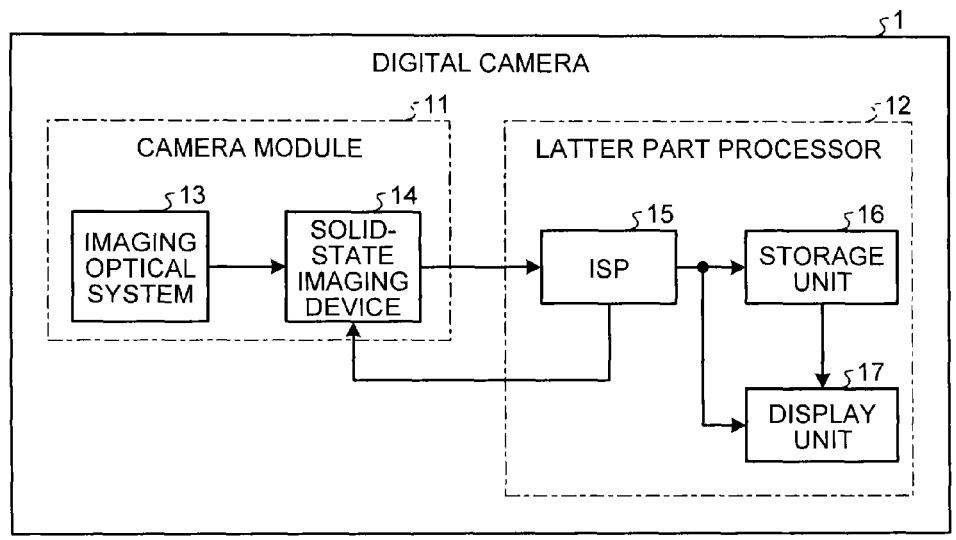
FIG. 1 is a block diagram illustrating a schematic configuration of a digital camera with a solid-state imaging device according to an embodiment.

FIG. 1 is a block diagram illustrating a schematic configuration of a digital camera 1 with a solid-state imaging device 14 according to an embodiment. As illustrated in FIG. 1, the digital camera 1 includes a camera module 11 and a latter part processor 12.

The camera module 11 includes an imaging optical system 13 and the solid-state imaging device 14. The imaging optical system 13 receives light from a photogenic subject and forms an image of a subject image. The solid-state imaging device 14 takes the photogenic subject image formed by the imaging optical system 13. An image signal obtained by taking the image is output to the latter part processor 12. The camera module 11, in addition to the digital camera 1, is applied, for example, to electronic devices such as a portable terminal with camera.

The latter part processor 12 includes an Image Signal Processor (ISP) 15, a storage unit 16, and a display unit 17. The ISP 15 performs a signal process of the image signal input from the solid-state imaging device 14. The ISP 15, for example, performs a high quality image process such as a denoising process, a defective pixel correction process, and a resolution conversion process.

Then, the ISP 15 outputs the image signal after the signal processing to the storage unit 16, the display unit 17, and a signal processing circuit 21, which will be described below (see FIG. 2). The signal processing circuit 21 is included in the solid-state imaging device 14 in the camera module 11. The image signal fed back from the ISP 15 to the camera module 11 is used for adjustment and control of the solid-state imaging device 14.

The storage unit 16 stores the image signal input from the ISP 15 as an image. The storage unit 16 outputs the image signal of the stored image to the display unit 17 according to, for example, an operation by the user. The display unit 17 displays an image corresponding to the image signal input from the ISP 15 or the storage unit 16. The display unit 17 is, for example, a liquid crystal display.

Next, with reference to FIG. 2, the solid-state imaging device 14 included in the camera module 11 will be described.

Figure 2:
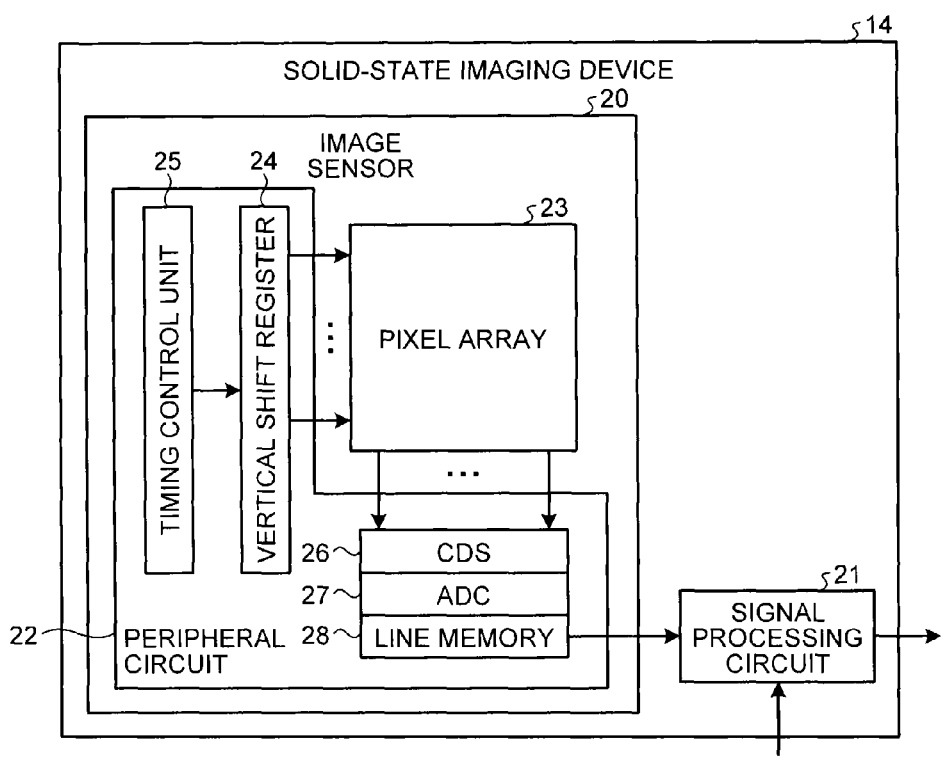
FIG. 2 is a block diagram illustrating a schematic configuration of the solid-state imaging device according to the embodiment.

FIG. 2 is a block diagram illustrating a schematic configuration of the solid-state imaging device 14 according to the embodiment. As illustrated in FIG. 2, the solid-state imaging device 14 includes an image sensor 20 and the signal processing circuit 21.

Here, a description will be given of the case where the image sensor 20 is a so-called back side illumination type Complementary Metal Oxide Semiconductor (CMOS) image sensor. In the back side illumination type Complementary Metal Oxide Semiconductor (CMOS) image sensor, a wiring layer is formed at a surface opposite to a surface where incident light for the photoelectric conversion element, which photoelectrically-converts the incident light, enters.

The image sensor 20 according to the embodiment is not limited to the back side illumination type CMOS image sensor. The image sensor 20 may be any given image sensor, such as a front side illumination type CMOS and a Charge Coupled Device (CCD) image sensor.

The image sensor 20 includes a peripheral circuit 22 and a pixel array 23. The peripheral circuit 22 includes a vertical shift register 24, a timing control unit 25, a correlated double sampling unit (CDS) 26, an analog-to-digital converter (ADC) 27, and a line memory 28.

The pixel array 23 is disposed in an imaging area of the image sensor 20. In the pixel array 23, a plurality of photoelectric conversion elements corresponding to respective pixels of the captured image is disposed in the horizontal direction (line direction) and the vertical direction (row direction) in a two-dimensional array pattern (matrix pattern). In the pixel array 23, each photoelectric conversion element corresponding to each pixel generates a signal charge (for example, electrons) corresponding to an amount of incident light and accumulates the signal charges.

The timing control unit 25 is a processor that outputs a pulse signal to the vertical shift register 24. The pulse signal becomes a criterion of operation timing. The vertical shift register 24 is a processor that outputs a selection signal to the pixel array 23. The selection signal is a signal for sequentially selecting a photoelectric conversion element to read the signal electric charge among the plurality of photoelectric conversion elements, which are two-dimensionally arranged in an array (matrix) pattern in units of lines.

The pixel array 23 outputs the signal electric charge from the photoelectric conversion element, which accumulates the signal electric charge, to the CDS 26 as a pixel signal indicating luminance of each pixel. This photoelectric conversion element is selected by the selection signal input from the vertical shift register 24 in units of lines.

The CDS 26 is a processor that removes noise from the pixel signal input from the pixel array 23 by correlated double sampling and then outputs the pixel signal to the ADC 27. The ADC 27 is a processor that converts an analog pixel signal input from the CDS 26 into a digital pixel signal and then outputs the digital pixel signal to the line memory 28. The line memory 28 is a processor that temporarily holds the pixel signals input from the ADC 27 and then outputs the pixel signals to the signal processing circuit 21 in units of lines of the photoelectric conversion elements in the pixel array 23.

The signal processing circuit 21 is a processor that performs a predetermined signal process to the pixel signal input from the line memory 28 and then outputs the pixel signal to the latter part processor 12. The signal processing circuit 21 performs a signal process, for example, lens shading correction, defect correction, and noise reduction process on the pixel signal.

Thus, the image sensor 20 takes an image as follows. The plurality of photoelectric conversion elements disposed at the pixel array 23 photoelectrically converts incident light into signal electric charges corresponding to the amount of the received light and then accumulates the signal electric charges. Then, the peripheral circuit 22 reads the signal electric charge accumulated in each photoelectric conversion element as a pixel signal.

In this embodiment, the shape of the plurality of photoelectric conversion elements arranged at the pixel array 23 of the image sensor 20 is optimized. This allows reduction in a dark current. Next, with reference to FIG. 3, the shape of the photoelectric conversion elements in plan view arrayed at the pixel array 23 will be described.

Figure 3:
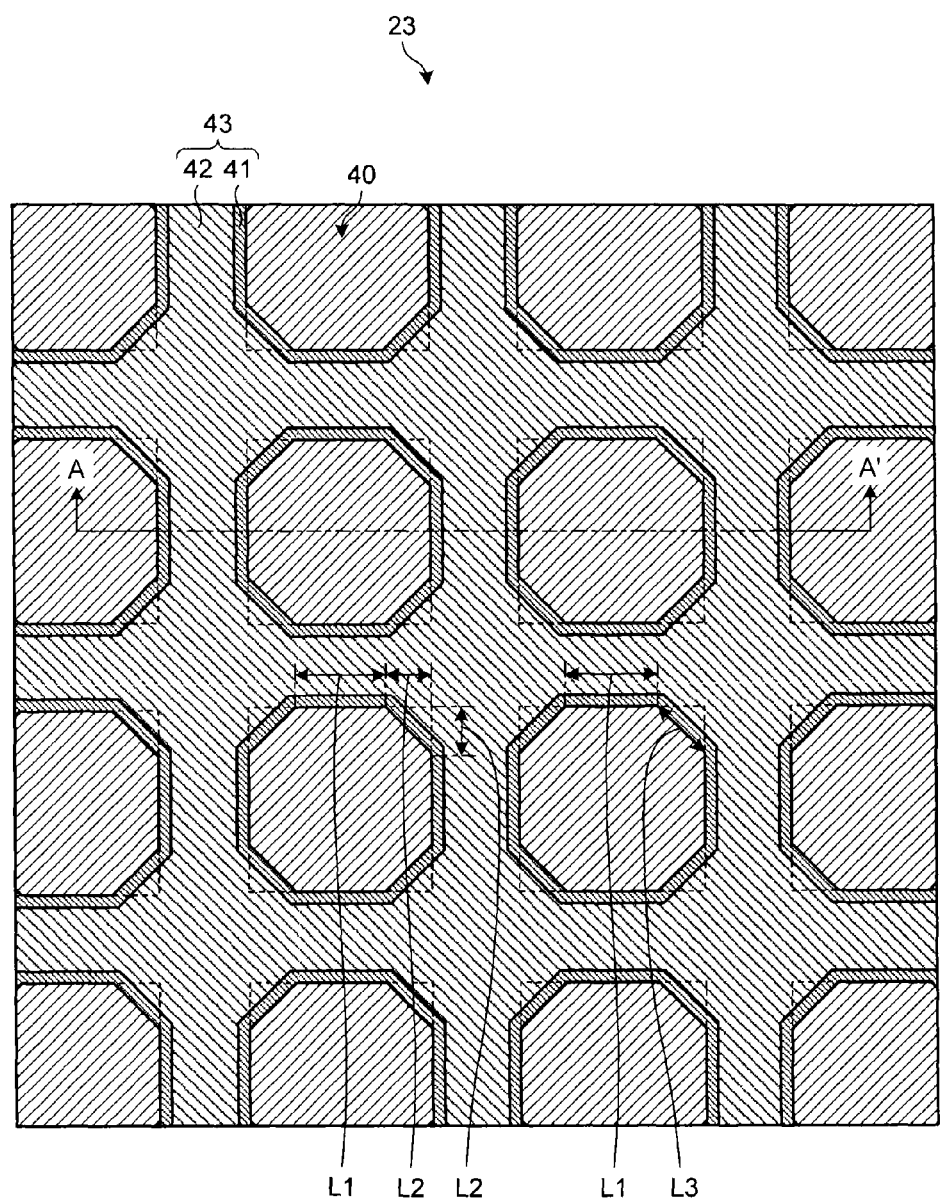
FIG. 3 is an explanatory view illustrating a shape of photoelectric conversion elements in plan view arrayed at a pixel array according to the embodiment.

FIG. 3 is an explanatory view illustrating a shape of photoelectric conversion elements in plan view arrayed at the pixel array 23 according to the embodiment. In FIG. 3, to indicate the shape of the photoelectric conversion element in plan view, an illustration of components disposed to the light-entry side of the photoelectric conversion element is omitted.

As illustrated in FIG. 3, the pixel array 23 includes a plurality of photoelectric conversion elements 40. The plurality of photoelectric conversion elements 40 is two-dimensionally arrayed in the matrix pattern. Each photoelectric conversion element 40 includes a convex polygonal photo-receiving surface in plan view (here, octagon) where the number of corners is larger than the number of corners of a rectangular.

Between each of photoelectric conversion elements 40, an element isolation area 43 is disposed. The element isolation area 43 is constituted with an insulating film 41 and a light shielding member 42. The insulating film 41 is disposed at an interface with the photoelectric conversion element 40. The light shielding member 42 is coated with the insulating film 41.

Thus, in this embodiment, the shape of each photoelectric conversion element 40 is formed to a convex polygonal shape in plan view. This allows reduction in a dark current. Specifically, to form the photoelectric conversion element 40, first, a photoelectric conversion element with a rectangular shape in plan view illustrated by dotted lines in FIG. 3 is formed. Such shape of the photoelectric conversion element, the rectangular shape in plan view, is a shape used for a usual solid imaging device.

To form the rectangular photoelectric conversion element in plan view, for example, a second conductivity type (here, an N type) impurities are ion-implanted to a formation position of the photoelectric conversion element at a first conductivity type (here, a P type) semiconductor layer. Thus, an N type semiconductor area is formed. A plurality of photodiodes, which is formed by PN bonding of the P type semiconductor layer and the N type semiconductor area, is formed. This forms a plurality of photodiodes two-dimensionally arranged in a matrix pattern.

Subsequently, a grid-like trench is formed at the semiconductor layer by, for example, Reactive Ion Etching (RIE) so as to surround each photodiode in a rectangular shape, for example. Then, the trench is embedded with an insulating member. This forms the rectangular photoelectric conversion element in plan view, which is illustrated by the dotted lines in FIG. 3.

The rectangular photoelectric conversion element in plan view thus formed has a rough side surface generated by RIE, generating dangling bond. Since an electron caused by dangling bond is generated regardless of existence of incident light, the electron appears as white defect in the captured image, causing image degradation. The number of electrons caused by the dangling bond increases proportionate to the area of the photoelectric conversion element.

Therefore, in this embodiment, the area of the side surface in the photoelectric conversion element is reduced. This reduces the number of electrons generated by dangling bond, providing the photoelectric conversion element 40 where a dark current is reduced.

Specifically, after forming the rectangular photoelectric conversion element in plan view, which is illustrated by the dotted lines in FIG. 3, the four corners of the rectangular photoelectric conversion element in plan view are chamfered. This forms the octagon photoelectric conversion element 40 in plan view. A specific formation process of the photoelectric conversion element 40 will be described below with reference to FIG. 6.

Here, in the case where lengths of respective portions of the photoelectric conversion element 40 in plan view are denoted as L1, L2, and L3 as illustrated in FIG. 3, the length of the outer periphery of the photoelectric conversion element in plan view indicated by the dotted lines in FIG. 3 is (L1+2×L2)×4.

On the other hand, the length of the outer periphery of the photoelectric conversion element 40 in plan view is (L1+L3)×4. Since L3=L2×√2 is met, the length of the outer periphery of the photoelectric conversion element 40 in plan view becomes shorter than the length of the outer periphery of the photoelectric conversion element in plan view indicated by the dotted lines in FIG. 3 by (2−√2)×L2×4.

Then, a depth of the photoelectric conversion element 40 at the semiconductor layer is equal to a depth of the photoelectric conversion element 40 at the semiconductor layer indicated by the dotted lines in FIG. 3. Accordingly, the photoelectric conversion element 40 has a smaller side surface area than the side surface area of the rectangular photoelectric conversion element in plan view indicated by the dotted lines in FIG. 3.

Thus, the side surface area of the photoelectric conversion element 40 can be reduced compared with the side surface area of the photoelectric conversion element indicated by the dotted lines in FIG. 3. This reduces the number of electrons generated by dangling bond, reducing a dark current.

Moreover, the photoelectric conversion element 40 has a distance between a pair of opposed sides among the respective sides constituting the outer periphery in plan view that is equal to a distance of a pair of opposed sides constituting the outer periphery of the photoelectric conversion element indicated by the dotted lines in FIG. 3. Accordingly, a photo-receiving area of the photoelectric conversion element 40 is not greatly reduced compared with a photo-receiving area of the photoelectric conversion element indicated by the dotted lines in FIG. 3. This allows ensuring light sensitivity equivalent to the photoelectric conversion element indicated by the dotted lines in FIG. 3.

Figure 4:
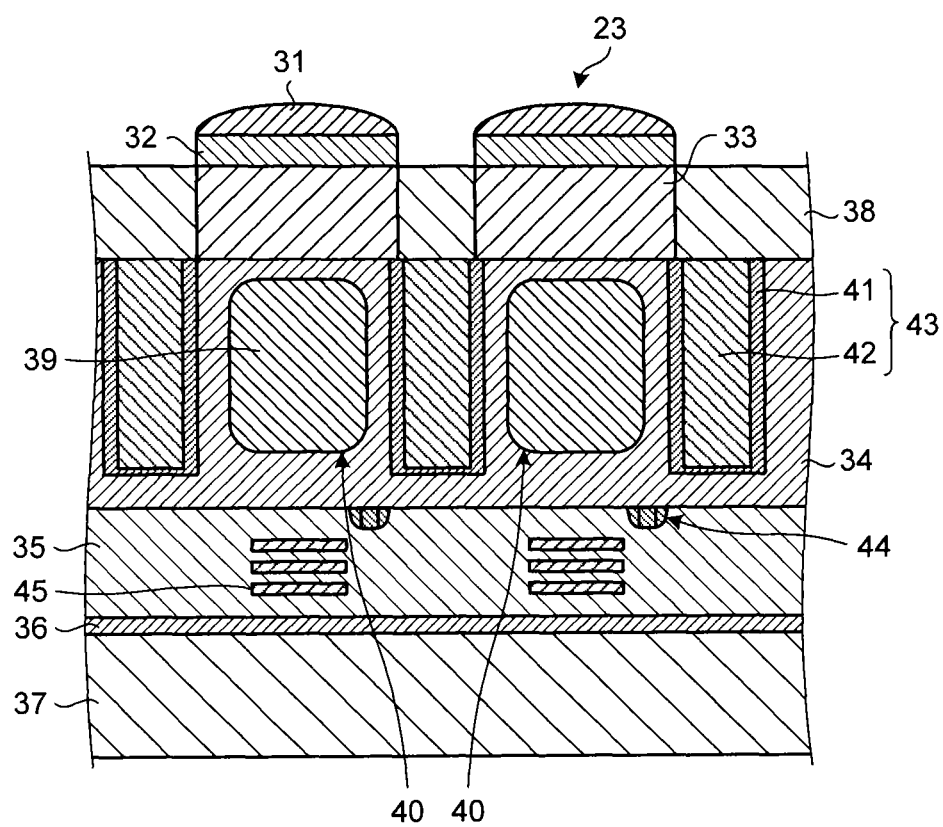
FIG. 4 is an explanatory view schematically illustrating a cross section taken along the line A-A' of FIG. 3.

Next, with reference to FIG. 4, a cross-sectional structure of the pixel array 23 according to the embodiment will be described. FIG. 4 is an explanatory view schematically illustrating a cross section taken along the line A-A" of FIG. 3. FIG. 4 also illustrates components disposed at the light-entry side of the photoelectric conversion element 40.

As illustrated in FIG. 4, the pixel array 23 includes a microlens 31, a color filter 32, a waveguide 33, a first conductivity type (P type) semiconductor (here, Si: silicon) layer 34, an insulating layer 35, an adhesive layer 36, and a supporting substrate 37 in order from the light incident side.

The microlens 31 is a plano-convex lens that collects incident light. The color filter 32 is a filter that selectively transmits one colored light of red, green, blue, or white. The waveguide 33 is an area that guides the light transmitting through the color filter 32 to the side of the P type Si layer 34.

The waveguide 33 is, for example, formed by Si nitride. A protective film 38 is formed around the waveguide 33. The protective film 38 is formed by, for example, Si oxide.

The P type Si layer 34 is an area formed by performing epitaxial growth on, for example, Si where P type impurities such as boron has been doped. The P type Si layer 34 may be formed by ion-implanting P type impurities to a Si wafer.

A second conductivity type (N type) Si area 39 is disposed in the P type Si layer 34 at a position where the photoelectric conversion element 40 is formed. In the pixel array 23, the photodiode, which is formed by PN joining of the P type Si layer 34 and the N type Si area 39, becomes the photoelectric conversion element 40.

The insulating layer 35 internally includes, for example, a reading gate 44 and a multilayer wiring 45. The reading gate 44 reads a signal electric charge from the photoelectric conversion element 40. The adhesive layer 36 and the supporting substrate 37 will be described below.

The element isolation area 43 is disposed between each of the photoelectric conversion elements 40. The element isolation areas 43 are disposed for every photoelectric conversion element 40 so as to partition the P type Si layer 34. The element isolation area 43 includes the light shielding member 42. The interface between the light shielding member 42 and the photoelectric conversion element 40 is coated with the insulating film 41.

More specifically, the element isolation area 43 surrounds the photoelectric conversion element 40 in a convex polygonal shape in plan view whose number of corners is larger than the number of corners of a rectangular (see FIG. 3). The element isolation area 43 is formed as follows. A grid-like trench in plan view is formed at the P type Si layer 34 between each of the photoelectric conversion elements 40. An anisotropic wet etching process using alkaline medicinal solution is performed. Then, the inner peripheral of the trench is coated with the insulating film 41, and the light shielding member 42 is embedded.

Next, a method of manufacturing the solid-state imaging device 14 including a forming method of the element isolation area 43 will be described with reference to FIGS. 5A to 7C. Manufacturing methods for portions other than the pixel array 23 in the solid-state imaging device 14 are similar to the manufacturing methods for the portions of a usual CMOS image sensor. In view of this, the following describes the manufacturing method of the pixel array 23 portion in the solid-state imaging device 14.

FIGS. 5A to 7C are schematic views of cross sections illustrating the manufacturing process of the solid-state imaging device 14 according to the embodiment. FIGS. 5A to 7C selectively illustrate the manufacturing process of the portion of the pixel array 23 illustrated in FIG. 4.

Figure 5A:
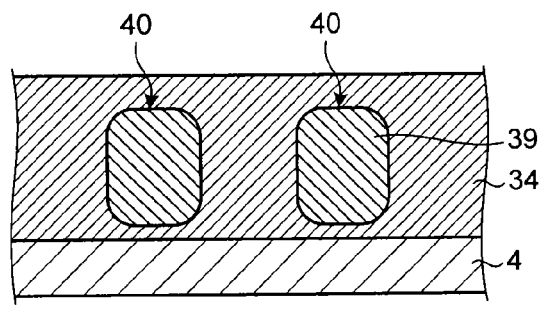

As illustrated in FIG. 5A, to manufacture the pixel array 23, the P type Si layer 34 is formed on a semiconductor substrate 4, for example, a Si wafer. At this time, the P type Si layer 34 is formed by performing epitaxial growth on, for example, a Si layer where P type impurities such as boron has been doped on the semiconductor substrate 4. The P type Si layer 34 may be formed by ion-implanting P type impurities to a Si wafer. The P type Si layer 34 may be formed by ion-implanting P type impurities to the inside of the Si wafer and performing the annealing process.

Subsequently, N type impurities, for example, phosphorus is ion-implanted to the position in the P type Si layer 34 where the photoelectric conversion element 40 is formed, and annealing process is performed. Thus, the N type Si areas 39 are two-dimensionally arranged at the P type Si layer 34 in a matrix pattern. Accordingly, the photoelectric conversion element 40, which is a photodiode, is formed by PN joining of the P type Si layer 34 and the N type Si area 39 at the pixel array 23.

Figure 5B:
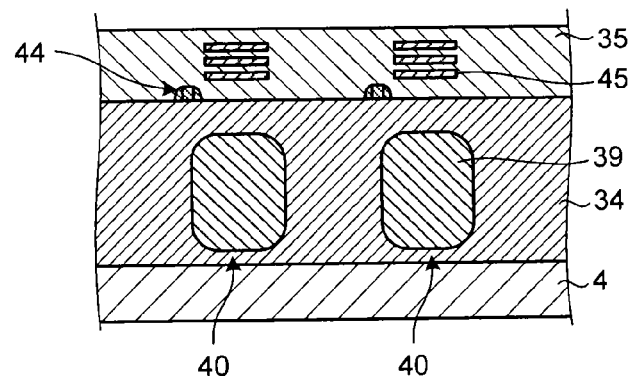

Thereafter, as illustrated in FIG. 5B, the insulating layer 35 is formed on the P type Si layer 34 together with, for example, the reading gate 44 and the multilayer wiring 45. In such process, after forming, for example, the reading gate 44 on the top surface of the P type Si layer 34, the following process are repeated: a process of forming an Si oxide layer, a process of forming a predetermined wiring pattern at the Si oxide layer, and a process of forming the multilayer wiring 45 by embedding, for example, Cu in the wiring pattern. This forms the insulating layer 35 that internally includes, for example, the reading gate 44 and the multilayer wiring 45.

Figure 5C:
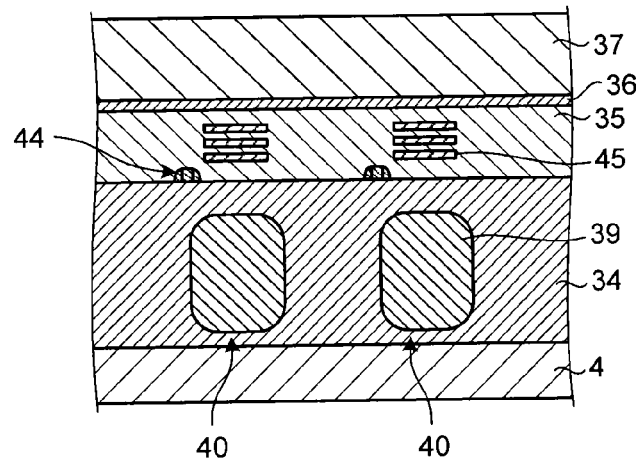
Figure 5D:
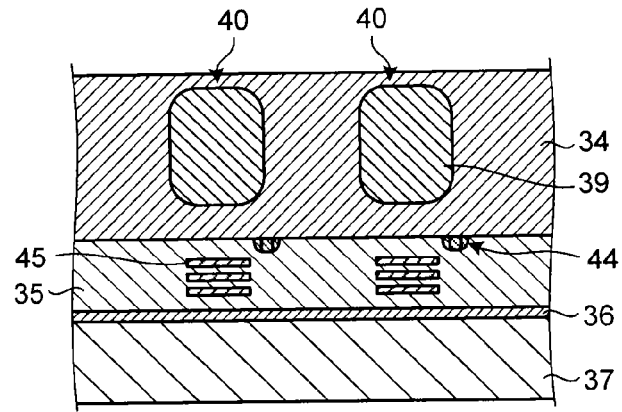

Then, as illustrated in FIG. 5C, an adhesive agent is applied on the top surface of the insulating layer 35 to form the adhesive layer 36. Then, for example, the supporting substrate 37, such as a Si wafer, is pasted on the top surface of the adhesive layer 36. Thereafter, the top and bottom of the structure illustrated in FIG. 5D is inverted. The semiconductor substrate 4 is polished from the back surface side (here, the top surface side) by a polishing apparatus, for example, a grinder. Then, the semiconductor substrate 4 is thinned to a predetermined thickness.

Furthermore, the back surface side of the semiconductor substrate 4 is further polished by, for example, Chemical Mechanical Polishing (CMP). As illustrated in FIG. 5D, the back surface (here, the top surface) that becomes a photo-receiving surface of the P type Si layer 34 is exposed.

Thereafter, as illustrated in FIG. 6A, a trench 5 for element isolation is formed at a position at the P type Si layer 34 where the element isolation area 43 (see FIG. 4) is to be formed, that is, a position between each of N type Si areas 39 by, for example, RIE.

At this time, the grid-like trenches 5 in plan view are formed so as to partition the P type Si layer 34 for every photoelectric conversion element 40 (see FIG. 3). Then, as illustrated in FIG. 6B, each photoelectric conversion element 40 is formed into a rectangular shape in plan view. This exposes surfaces 40a, 40b, 40c, and 40d. The surface 40a has a Miller index of [100] in each photoelectric conversion element 40. Meanwhile, the surfaces 40b, 40c, and 40d are equivalent to the surface having a Miller index of [100]. The bottom surface of the trench 5 formed here is a surface having a Miller index of [111].

Thereafter, anisotropic wet etching using alkaline medicinal solution is performed on the photoelectric conversion element 40. In the anisotropic wet etching using alkaline medicinal solution, compared with an etching rate at the surface 40a of Si having a Miller index of [100], an etching rate at the surface having a Miller index of [110] is considerably high.

In view of this, performing the anisotropic wet etching on the photoelectric conversion element 40 exposes surfaces 40e, 40f, 40g, and 40h as illustrated in FIG. 6C. The surface 40e has a Miller index of [110] in each photoelectric conversion element 40. Meanwhile, the surfaces 40f, 40g, and 40h are equivalent to the surface having a Miller index of [110]. That is, each photoelectric conversion element 40, which had a rectangular shape in plan view at the phase of forming the trench 5, is formed into a convex polygonal shape in plan view (here, octagon) where the number of corners is larger than the number of corners of a rectangular.

Accordingly, in this embodiment, the area of the side surface (peripheral surface) of each photoelectric conversion element 40 can be reduced without greatly decreasing the area of the effective photo-receiving surface in each photoelectric conversion element 40. Thus, in the pixel array 23, the area of the side surface (peripheral surface) of each photoelectric conversion element 40 possibly causing dangling bond can be reduced. Accordingly, the number of electrons caused by the dangling bond, regardless of existence of incident light, can be reduced. Therefore, with the pixel array 23, a dark current can be reduced.

In the anisotropic wet etching using alkaline medicinal solution, compared with an etching rate at the surface 40e of Si having a Miller index of [110], an etching rate at the surface having a Miller index of [111] is considerably low. In view of this, the anisotropic wet etching allows suppressing the trench 5 to be formed deep beyond necessity.

In this embodiment, wet etching is performed after forming the trench 5 by dry etching using RIE. Therefore, a rough surface of the trench 5 caused by RIE can be restored. This reduces dangling bond at the pixel array 23, reducing a dark current.

Figure 7A:
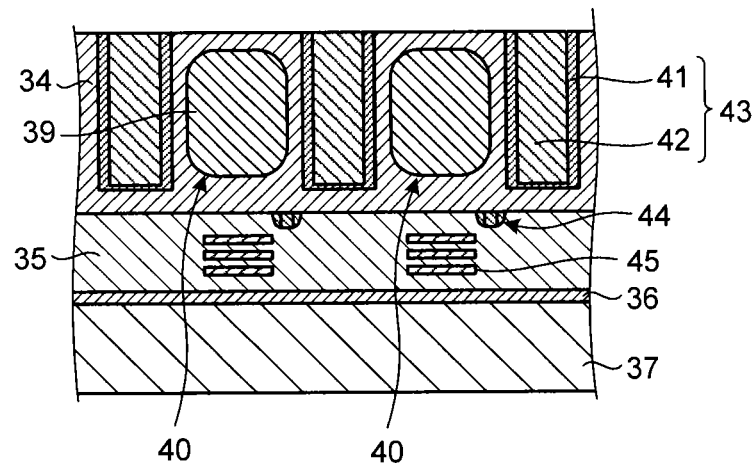

Then, as illustrated in FIG. 7A, the insulating film 41, for example, Si oxide, is formed at an inner peripheral surface of the trench 5 by using, for example, Chemical Vapor Deposition (CVD) and spatter. The light shielding member 42, such as aluminum, is embedded to the inside of the trench 5 where an inner peripheral surface is coated with the insulating film 41 using, for example, CVD. This forms the element isolation area 43.

Thus, in this embodiment, after the inner peripheral surface of the trench 5 is coated with the insulating film 41, the element isolation area 43 is formed by embedding the light shielding member 42 to the inside of the trench 5. Accordingly, between each of the photoelectric conversion elements 40 can be elementally isolated electrically and optically.

Accordingly, with the pixel array 23, since invasion of light and electron to the photoelectric conversion element 40 from the photoelectric conversion element 40 side adjacent to the photoelectric conversion element 40 can be prevented, thus reducing a mixed color in the captured image.

The P type Si layer 34 in the photoelectric conversion element 40 surrounded by the element isolation area 43 has a light refractive index of around 4. The insulating film 41 formed of Si oxide constituting the peripheral surface of the element isolation area 43 has a light refractive index of around 1.5.

Furthermore, as described above, the element isolation area 43 octagonally surrounds the photoelectric conversion element 40 in plan view. In view of this, light that enters the photoelectric conversion element 40 all reflects at the peripheral surface of the element isolation area 43. Accordingly, with the element isolation area 43 according to the embodiment, light sensitivity can be improved.

Figure 7B:
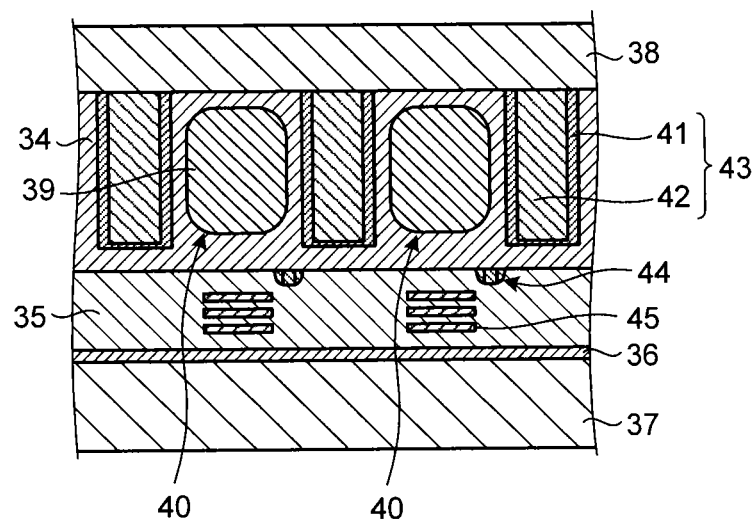

Then, as illustrated in FIG. 7B, Si oxide is laminated on the top surface of the P type Si layer 34 using, for example, CVD. This forms the protective film 38, and as illustrated in FIG. 7C, the protective film 38 on the photoelectric conversion element 40 is selectively removed.

Figure 7C:
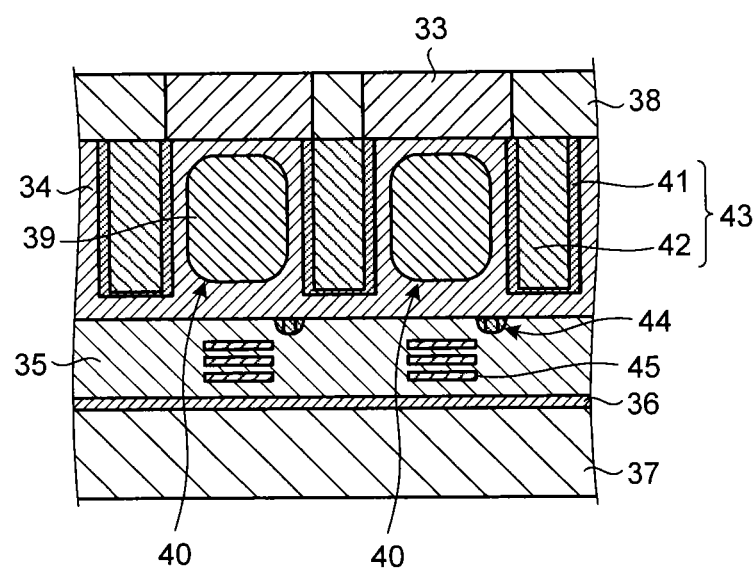

Then, as illustrated in FIG. 7C, an opening is formed by selectively removing the protective film 38. Si nitride is laminated inside of the opening using, for example, CVD. Thus, the waveguide 33 is formed. After that, the color filter 32 and the microlens 31 are sequentially formed on the top surface of the waveguide 33, thus the pixel array 23 illustrated in FIG. 4 is formed.

The case where the image sensor 20 according to the embodiment is a back side illumination type is described above. However, the configurations of the above-described photoelectric conversion element 40 and the element isolation area 43 are also applicable to a front side illumination type image sensor.

Figure 8:
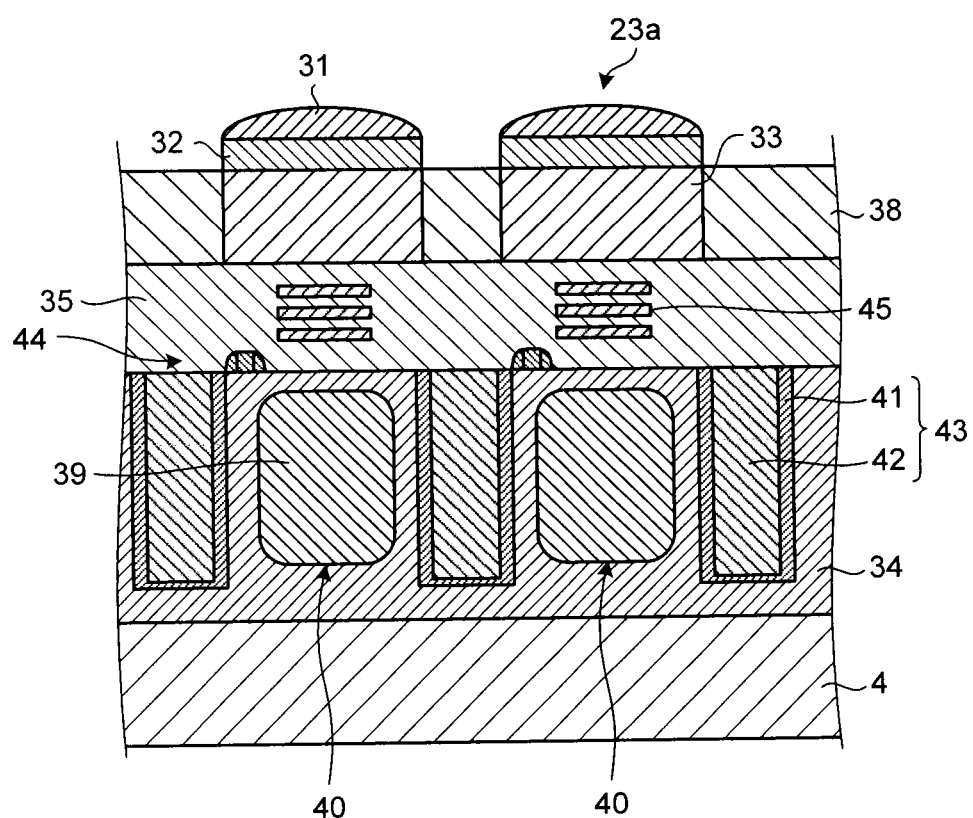
FIG. 8 is an explanatory view in the case where configurations of the photoelectric conversion element and the element isolation area according to the embodiment are employed for an image sensor of a front side illumination type.

FIG. 8 is an explanatory view in the case where configurations of the photoelectric conversion element 40 and the element isolation area 43 according to the embodiment are employed for an image sensor of a front side illumination type. FIG. 8 schematically illustrates a part of a cross section of a pixel array 23a in the front side illumination type image sensor. Among the components illustrated in FIG. 8, components with similar function to the components illustrated in FIG. 4 are described where like reference numerals designate corresponding or identical elements throughout the description that follows.

As illustrated in FIG. 8, the pixel array 23a has a similar configuration to the pixel array 23 illustrated in FIG. 4 other than the following. The P type Si layer 34 is disposed on the semiconductor substrate 4. The insulating layer 35 where the reading gate 44 and the multilayer wiring 45 are disposed is disposed at the photo-receiving surface (top surface) side of the P type Si layer 34.

Thus, in the case where the configurations of the photoelectric conversion element 40 and the element isolation area 43 according to the embodiment are employed for the front side illumination type image sensor, the forming methods and the configurations of the photoelectric conversion element 40 and the element isolation area 43 are similar to the forming methods and the configurations of the pixel array 23 illustrated in FIG. 4.

Accordingly, the pixel array 23a illustrated in FIG. 8 also allows reducing the area of the side surface (peripheral surface) of each photoelectric conversion element 40 without greatly decreasing the effective photo-receiving surface in each photoelectric conversion element 40. This reduces a dark current.

As described above, with the method of manufacturing the solid-state imaging device according to the embodiment, the rectangular photoelectric conversion element in plan view is formed by forming a grid pattern trench for element isolation in plan view. Then, anisotropic wet etching using alkaline medicinal solution is performed on the photoelectric conversion element.

Accordingly, the photoelectric conversion element is formed into a convex polygonal shape in plan view whose number of corners is larger than the number of corners of a rectangular. The area of the side surface (peripheral surface) of the photoelectric conversion element can be reduced. Thus, the area of the side surface (peripheral surface) of each photoelectric conversion element possibly causing dangling bond can be reduced. Accordingly, the number of electrons caused by the dangling bond, regardless of existence of incident light, can be reduced. Therefore, with the pixel array, a dark current can be reduced.

With the photoelectric conversion element according to the embodiment that includes a convex polygonal shape in plan view whose number of corners is larger than the number of corners of a rectangular, light sensitivity approximately equivalent to the rectangular photoelectric conversion element in plan view that has the same distance between a pair of opposed sides constituting the outer periphery can be ensured.

In the above-described embodiment, an example of forming the photoelectric conversion element into an octagon shape in plan view is described. However, the photoelectric conversion element may be formed into any given convex polygonal shape in plan view whose number of corners is larger than the number of corners of a rectangular, or may be formed into a circular shape in plan view. In this case, for example, an opening with a desired shape in plan view is formed by performing etching using a mask disposed on each photoelectric conversion element.

Accordingly, the more the number of corners of the photoelectric conversion element with polygonal convex shape in plan view and the more the photoelectric conversion element close to a circular shape in plan view, the area of the side surface of the photoelectric conversion element can be narrower than the photoelectric conversion element illustrated in FIG. 3. This allows further reducing a dark current.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a solid-state imaging device, comprising:
    forming a plurality of photoelectric conversion elements by two-dimensionally arranging semiconductor areas of a second conductivity type at a semiconductor layer of a first conductivity type in a matrix pattern;
    forming the photoelectric conversion elements in a rectangular shape in plan view by isotropic dry etching, the photoelectric conversion elements being formed by forming a grid-like trench in plan view so as to partition the semiconductor layer;
    forming, by anisotropic wet etching using an alkaline medicinal solution, the photoelectric conversion element formed into the rectangular shape in plan view into a convex polygonal shape in plan view whose number of corners is larger than the number of corners of a rectangular; and
    forming an element isolation area including a light shielding member at a trench coated with an insulating film after coating an inner peripheral surface of the trench with the insulating film;
    wherein the polygonal convex shape in plan view is an octagon shape in plan view.

2. The method of manufacturing a solid-state imaging device according to claim 1, wherein
    the forming the trench exposes a surface having a Mirror index of [100] and a surface having a Mirror index equivalent to the Mirror index of [100] in the photoelectric conversion element, and
    the performing the anisotropic wet etching exposes a surface having a Mirror index of [110] and a surface having a Mirror index equivalent to the Mirror index of [110] in the photoelectric conversion element.

3. The method of manufacturing a solid-state imaging device according to claim 1, wherein
    the trench has a bottom surface having a Miller index of [111].

* * * * *